(12) United States Patent
Jones (10) Patent No.: US 10,484,776 B2
(45) Date of Patent: *Nov. 19, 2019

(54) HEADPHONES WITH MULTIPLE EQUALIZATION PRESETS FOR DIFFERENT GENRES OF MUSIC

(71) Applicant: Global Drumz, Inc., Los Angeles, CA (US)

(72) Inventor: Quincy Jones, Los Angeles, CA (US)

(73) Assignee: GLOBAL DRUMZ, INC., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/947,710

(22) Filed: Apr. 6, 2018

(65) Prior Publication Data

US 2018/0242072 A1 Aug. 23, 2018

Related U.S. Application Data

(63) Continuation-in-part of application No. 15/620,123, filed on Jun. 12, 2017, now abandoned, which is a
(Continued)

(51) Int. Cl.
*H04R 1/10* (2006.01)
*H03G 5/00* (2006.01)
(Continued)

(52) U.S. Cl.
CPC ........... *H04R 1/1041* (2013.01); *H03G 5/005* (2013.01); *H03G 5/025* (2013.01); *H03G 5/165* (2013.01);
(Continued)

(58) Field of Classification Search
CPC ..... H04S 7/307; H04R 1/1041; H04R 1/1008; H04R 3/08; H03G 5/005; H03G 5/165; H03G 5/025
(Continued)

(56) References Cited

U.S. PATENT DOCUMENTS 4,955,729 A 9/1990 Marx et al.
7,471,988 B2 12/2008 Smith et al.
(Continued)

OTHER PUBLICATIONS

Gigaware 43-215 Premium Digital USB Stereo Headphones with Preset EQ and Microphone, User Manual, 2010.
(Continued)

*Primary Examiner* — Vivian C Chin
*Assistant Examiner* — Douglas J Suthers
(74) *Attorney, Agent, or Firm* — Corridor Law Group, P.C.

(57) ABSTRACT

A headphone comprises a plurality of actuatable equalization selectors. Each of the selectors corresponds to an equalization setting that includes a preset distribution of relative amplitudes of sounds in predetermined frequency ranges. In one embodiment, each of the plurality of actuatable equalization selectors is a button-type switch. A knob-type switch or a voice recognition mechanism can also actuate an equalization setting. In a preferred embodiment, an equalizer identification indicator produces a communication perceivable to a headphone wearer and which corresponds to an equalization setting. The communication can be audible or tactile. In some embodiments, the communication is a piece of music or a sound imitation associated with a particular genre of music that corresponds to the equalization setting selected by a headphone wearer. In some embodiments, the communication is an audio clip created or selected by a user and stored in the headphone.

9 Claims, 7 Drawing Sheets

Related U.S. Application Data continuation of application No. 14/605,794, filed on Jan. 26, 2015, now Pat. No. 9,681,212, which is a continuation-in-part of application No. 14/070,419, filed on Nov. 1, 2013, now Pat. No. 8,942,385.

(51) Int. Cl.
*H03G 5/16* (2006.01)
*H04S 7/00* (2006.01)
*H03G 5/02* (2006.01)
*H04R 3/08* (2006.01)

(52) U.S. Cl.
CPC .............. *H04R 3/08* (2013.01); *H04R 1/1008* (2013.01); *H04S 7/307* (2013.01)

(58) Field of Classification Search
USPC ..... 381/74, 72, 101, 103, 98, 104, 384, 394, 381/73.1
See application file for complete search history.

(56) References Cited

U.S. PATENT DOCUMENTS

| | | |
|---|---|---|
| 7,711,129 B2 | 5/2010 | Lindahl et al. |
| 7,907,738 B2 | 3/2011 | King et al. |
| 7,928,310 B2 | 4/2011 | Georges et al. |
| 2009/0046868 A1 | 2/2009 | Engle et al. |
| 2012/0063614 A1 | 3/2012 | Crockett et al. |

OTHER PUBLICATIONS

ZOpid HE-ZM5800, User Manual, 2011.
FiiO E11 Headphone Amplifier, User Manual, Date unknown.

Prior Art

FIG. 1C

Prior Art

FIG. 1D

Prior Art

FIG. 1E

Prior Art

HEADPHONES WITH MULTIPLE EQUALIZATION PRESETS FOR DIFFERENT GENRES OF MUSIC

CROSS-REFERENCE TO RELATED APPLICATIONS

This application is a continuation-in-part and claims priority to U.S. application Ser. No. 15/620,123 filed on Jun. 12, 2017. The '123 application is, in turn, a continuation of and claims priority to U.S. application Ser. No. 14/605,794 filed on Jan. 26, 2015, now U.S. Pat. No. 9,681,212 issued on Jun. 13, 2017. The '794 application is a continuation-in-part of and claims priority to U.S. application Ser. No. 14/070,419 filed on Nov. 1, 2013, now U.S. Pat. No. 8,942,385 issued on Jan. 27, 2015.

The '123, '794, '212 and '419 applications are hereby incorporated by reference herein in their entireties.

FIELD OF THE INVENTION

The present invention relates to audio equipment and, in particular, to headphones and equalizer settings for adjusting the quality of sound delivered to headphone wearers.

BACKGROUND OF THE INVENTION

Sound engineers focus on delivering high quality sounds to human ears. Human ears perceive certain frequencies as being louder than others, despite having the same or even more energy behind those frequencies. The frequency range of sounds perceivable to human ears is around 20-20,000 Hz; the closer those boundaries are approached or exceeded, the softer the sound is perceived. Room and automobile interiors, arenas, stadiums and other open spaces, as well as speakers and other sound reproducing devices (including headphones) come in countless shapes, sizes, and configurations. The same note from the same instrument can sound different to human ears depending upon the environment and equipment with which the sound is being reproduced.

Tone controls (usually designated as the bass and treble controls or knobs) are simple filters included in most audio equipment for gross adjustment of the frequency balance. The bass control can be used, for instance, to increase the prominence of the lower frequency bass and drum parts of a song, or to reduce unpleasant bass sounds when listening to a person speaking. The treble control can be used to give the higher frequency percussion and vocal parts of a song a sharper or more brilliant sound, or to decrease the prominence of higher frequencies that might have been overemphasized in a song, all based upon the preferences of the listener.

Equalizers are software or hardware filters that adjust the volume or loudness of specific audible sound frequencies. Equalizers work in frequency ranges or bands, adjusting the amplitude of audio signals at particular frequencies. The treble and bass controls discussed in the previous paragraph are dual-band equalizers, providing the ability to adjust (cut and boost) the high and low frequency ranges, respectively. Higher quality sound systems can have three bands (providing a mid-range band in addition to treble and bass), five bands (three mid-range bands between treble and bass), and even twelve bands (even more mid-range frequency gradations between treble and bass). The greater the number of bands, the more divisions in the wide range of human hearing. Each band thus corresponds to a discrete range of frequencies, thereby allowing more control over the sound delivered at those frequencies. Professional sound engineers typically employ recording equipment with 20-30 or more frequency bands.

In music production and recording, equalizers are used to adjust the timbre and tone of individual instruments by their frequency content, to make certain instruments or voices more prominent, and to generally fit individual instruments and voices within the overall frequency spectrum of the sound mix. Equalization can also be used to reduce or eliminate unwanted sounds in a sound recording, such as hiss or other distortion, or to alleviate feedback (howling) in a public address system.

Equalizer settings are most often associated with particular genres of music. For a Rhythm and Blues style song, a slight dip in the mid-range frequencies will increase the prominence of the bass and the singing. Listeners of Rock genres often prefer a dip in the treble frequencies so that bass guitars and standard mid-range guitars are heard more prominently. For Voice and Pop genres, listeners typically prefer to emphasize the middle and treble ranges, leaving the lower frequency and bass ranges on a less prominent setting.

Graphic equalizers (abbreviated EQs) are often included in consumer audio equipment and software, which play on speakers (or headphones) music signals delivered from consumer devices such as smart phones, iPods, digital tablets, personal computers, disc players, radios, record turntables and the like. An EQ allows the listener to selectively adjust the amplitude of specific frequency ranges without changing the amplitude of other frequency ranges. An EQ display typically includes a digital image of sliders, each of which controls the volume of a certain frequency range of sounds. The bass and treble sliders adjust the amplitude of frequencies that are below and above a certain level, respectively. Each of the sliders in the middle has a range that controls the volume of sound frequencies between a lower limit and an upper limit. The sliders are typically arranged in a row on a control panel display, with the bass slider on the left, the treble slider on the right, and the mid-range sliders in the middle. When arranged horizontally, moving the sliders vertically increases the amplitude of the signal within their particular frequency range.

Figure 1:
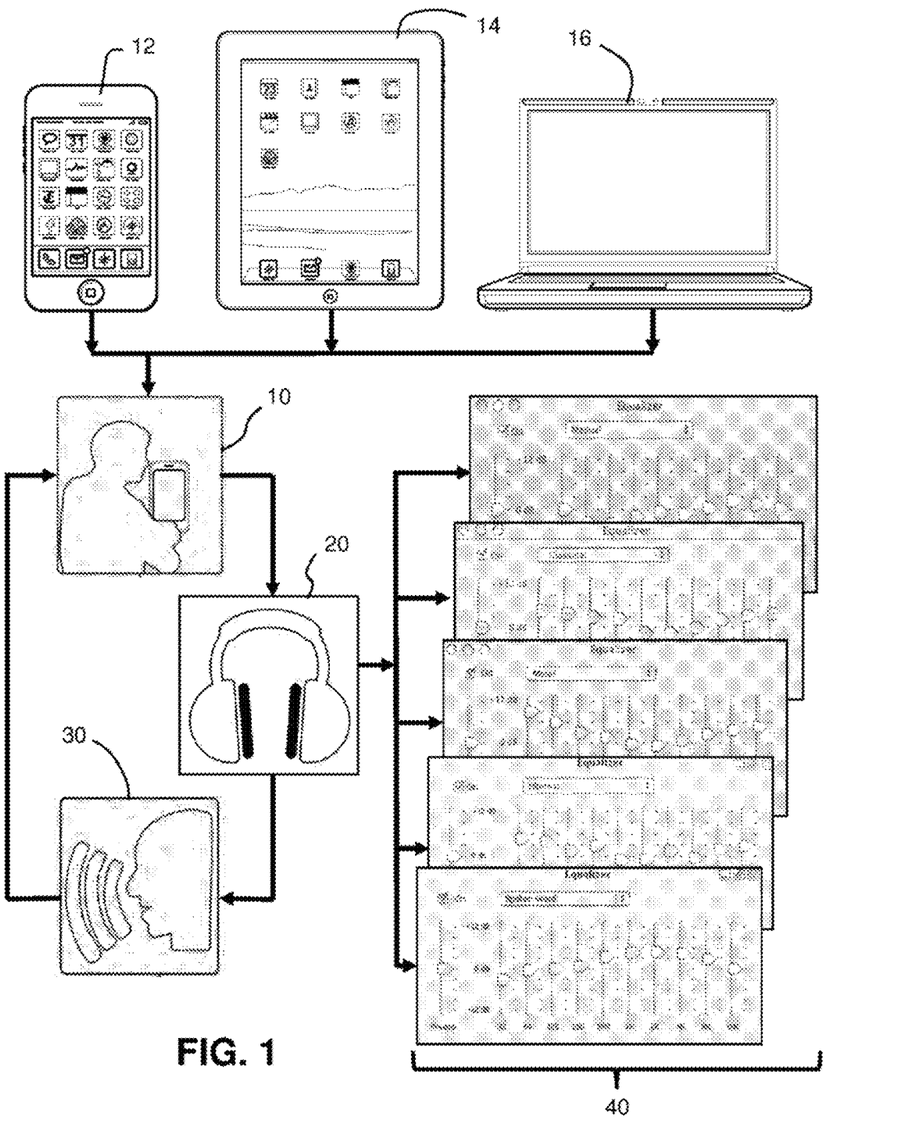
FIG. 1 is a flow diagram showing the functions carried out by the present headphones with multiple equalization presets for different genres of music.
Figure 1A:
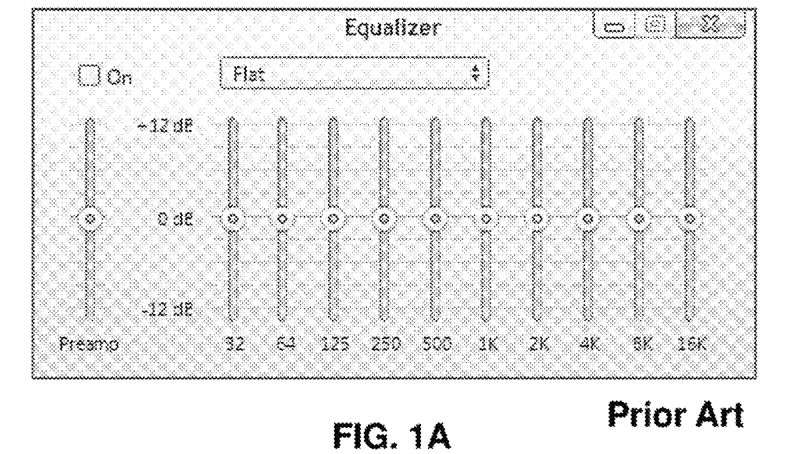
FIGS. 1A through 1F are illustrations of exemplary EQ displays on the screen of a digital device having sound producing and delivery capabilities, showing, respectively, a Flat EQ setting, a Manual EQ setting, a Classical EQ setting, a Hip Hop EQ setting, a Metal EQ setting, and a Spoken Word EQ setting.
Figure 1B:
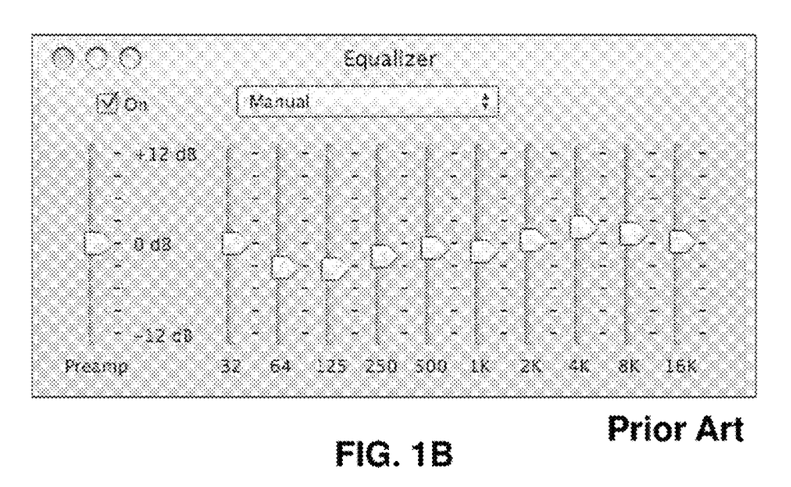

FIGS. 1A-1F illustrate examples of digital EQs as presented on the screen or display of a digital device, such as a smart phones, iPod, digital tablet or iPad, laptop or desktop computer, from which music and other sounds can be produced and delivered to a sound reproducing device, such as speakers or headphones. FIG. 1A represent a Flat EQ setting, in which all of the frequency range sliders are set in the zero position, no one slider, and hence no one frequency range having an amplitude any greater or less than another. FIG. 1B represents a Manual EQ setting, in which the sliders that control the amplitude of each frequency range are set differently with respect to the zero (or flat) position, according to the preferences of the listener. As shown, the sliders above the flat position are the frequency ranges being boosted (given more amplitude), while the sliders below the flat position are being cut (given less amplitude). Electronically storing these slider positions for recall at a later time would be referred to as creating a Preset.

Figure 1C:
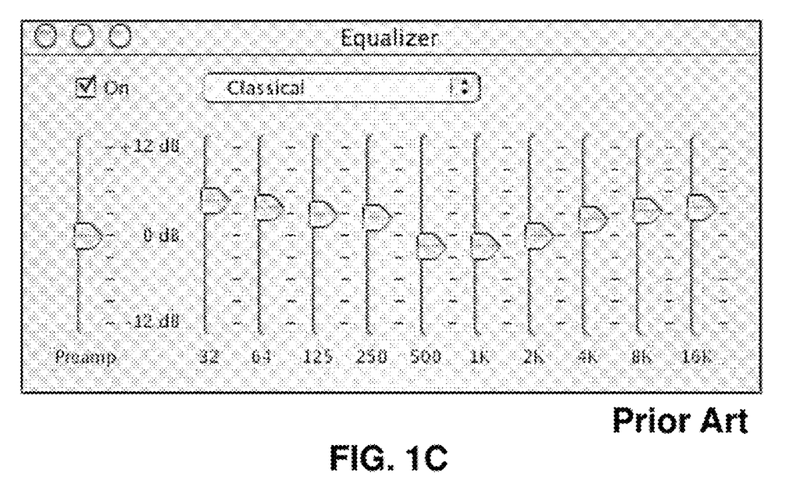
Figure 1D:
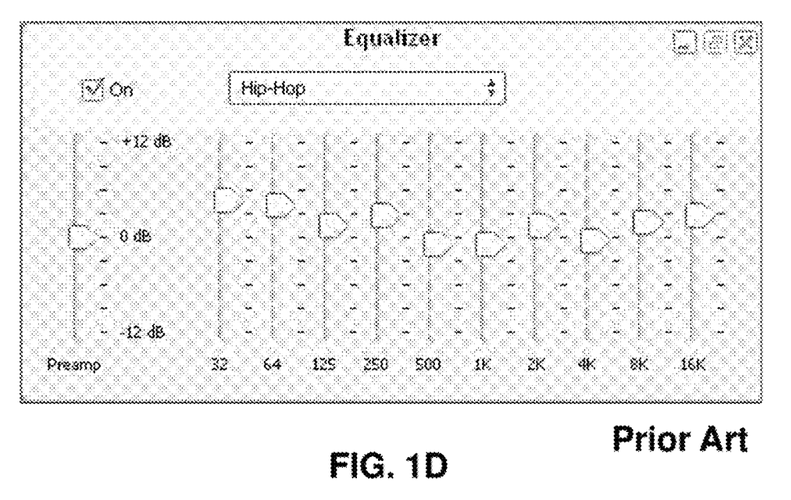
Figure 1E:
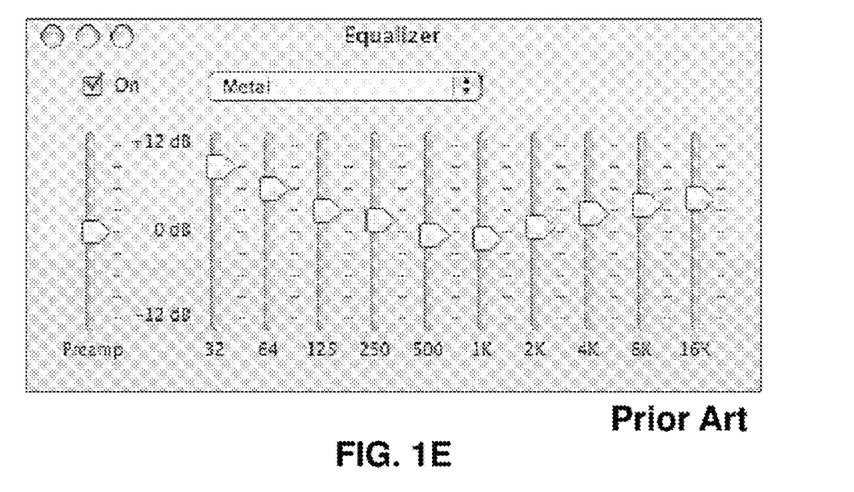
Figure 1F:
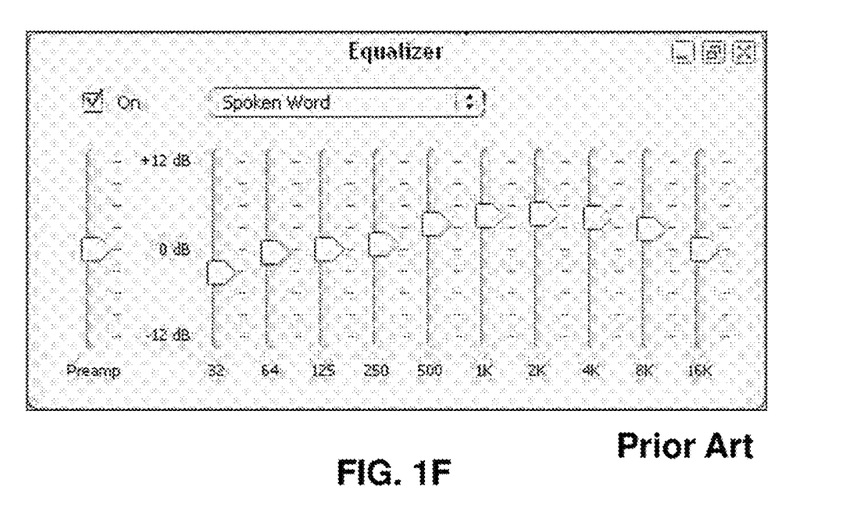

FIG. 1C illustrates an exemplary Classical music genre EQ setting, with the sliders controlling the ten frequency ranges boosting ranges at the lower and upper ends of the mix or overall frequency range and cutting ranges in the middle of the mix. Similarly, FIG. 1D illustrates an exemplary Hip-Hop music genre EQ setting, with frequency ranges boosted and cut according to how sounds in these ranges particular to Hip-Hop music should be emphasized and deemphasized with respect to sounds in other frequency ranges. FIGS. 1E and 1F illustrate exemplary Metal and Spoken Word genre EQ settings, respectively. Many other genres could also be illustrated, such as Jazz, Pop, and Swing, each with its own arrangement of frequency ranges being boosted, cut or kept flat.

Reproducing sounds, particularly music, with headphones presents unique challenges. Headphone wearers want to listen to different genres of music using a music device of their choice and without having to sacrifice the tonal quality of the sound. The goal is to provide headphones that enable wearers to hear the intended subtleties of different types of music without having to change the type of headphone they are wearing. When listening to Rap music, deep bass sounds should be highlighted. When listening to Classical music, the delicate treble overtones should be crisp and clear. The quality of the sound should not have to be sacrificed just because the headphone being worn is designed for certain genres of music and not others. For this reason, a music genre equalizer selector, placed at a convenient location on the headphone itself, would enable the wearer to switch back and forth between different audio equalizers to enhance the music listening experience.

In the past, headphone developers have created headphones geared towards specific genres. For example, Beats headphones are geared specifically towards Rap and Pop songs with heavy bass. Bose headphones are geared more towards classical music and jazz. The goal of headphone manufacturers has been to exploit niche markets and capitalize on wearers' desires for headphones that suit their specific music genre preferences.

The present headphone design serves wearers whose tastes are not so limited and cover a music library from end to end. Prior attempts at creating a robust aural experience with headphones have thus fallen short because they do not accommodate a full musical spectrum.

SUMMARY OF THE INVENTION

Shortcomings of prior headphone equalization techniques are overcome by a headphone comprising a plurality of actuatable equalization selectors. Each of the selectors corresponds to an equalization setting comprising a preset distribution of relative amplitudes of sounds in predetermined frequency ranges. In one embodiment, the plaster trough support system.

In one embodiment of the present headphone design, each of the plurality of actuatable equalization selectors comprises a button-type switch. The button-type switch can be actuated by depressing or by detection of heat emanating from a human body part.

In another embodiment of the present headphone design, the plurality of actuatable equalization selectors comprises a knob-type switch.

In a preferred embodiment of the present headphone design, the plurality of actuatable equalization selectors comprises a mechanism capable of recognizing vocalized sounds of a headphone wearer. The voice recognition mechanism actuates an equalization setting corresponding to a recognized sequence of vocalized sounds.

In a preferred embodiment, the present headphone design further comprises an equalizer identification indicator. The indicator is capable of producing a communication perceivable to a headphone wearer and which corresponds to an equalization setting. The communication can be audible or tactile. The audible communication preferably comprises a human voice. The tactile communication preferably comprises vibration patterns in which each of the vibration patterns corresponding to an equalization setting.

In some embodiments, the communication is a piece of music or a sound imitation associated with a particular genre of music that corresponds to the equalization setting selected by a headphone wearer.

In some embodiments, the communication is a custom audio clip created by the user and stored in the headphone to represent a particular genre of music that corresponds to a specific equalization setting.

DETAILED DESCRIPTION OF ILLUSTRATIVE EMBODIMENT(S)

Turning first to FIG. 1, a listener 10 of a musical selection wishes to use headphone 20 to reproduce the music selected from the library of a digital device, three of which are illustrated in FIG. 1 as smartphone 12, digital tablet 14 and laptop 16. Listener 10 actuates a selector on headphone 20 to select an equalization setting from among a menu of equalization settings 40, each individual setting corresponding to a particular genre of music or sound. Optionally, headphone 20 includes a spoken voice capability 30, which announces to the listener the identity of the musical genre selected.

In some embodiments, spoken voice capability 30 uses the voices of a particular artist and/or artists that one skilled in the art would readily identify as being representative of the particular genre related to the selected equalization setting to identify the selected genre of the equalization setting. For example, if a Hip Hop EQ setting is chosen, a notable hip-hop artist can serve as the spoken voice that identifies the genre selected. If a Classical EQ setting is chosen, a classical artist or conductor could serve as the spoken voice that identifies the genre selected. If a Metal EQ setting is chosen, a heavy-metal artist could serve as the identifying spoken voice. If a Pop EQ setting is chosen, a pop artist could serve as the identifying spoken voice. If a Rock EQ setting is chosen, a rock artist could serve as the identifying spoken voice. If a Rap EQ setting is chosen, a rap artist could serve as the identifying spoken voice. In some cases, the spoken voice that identifies the genre selected can be an artist who performed musical works of that genre. In some embodiments, the particular artist or artists can sing rather than speak to identify the genre selected.

In some embodiments, the equalizer identification indicator is a piece of music produced by a single musical instrument or a collection of musical instruments related to the equalization setting selected. For example, if a Classical EQ setting is chosen, a trumpet fanfare could serve as the indicator. If a Rock EQ setting is chosen, an electronic guitar solo could serve as the indicator.

In some embodiments, the equalizer identification indicator is a song or instrumental musical composition that one skilled in the art would readily identify as being representative of the selected genre of the equalization setting. For example, if a Classical EQ setting is chosen, an excerpt of a well-known symphony could serve as the indicator. If a Pop EQ setting is chosen, an excerpt of famous pop song could serve as the indicator. If a Rock setting is chosen, a recognizable guitar riff or progression on piano could serve as the indicator.

In some embodiments, the equalizer identification indicator can be a sound imitation associated with or reminiscent of a particular genre of music. A sound imitation can emulate a sound of nature, a mechanical object, a mechanical process or machinery. For example, a Metal EQ setting could be indicated by the sound of grinding, welding or cutting metal.

In some embodiments, the headphone can be configured to allow a user to select, record, customize or otherwise implement his or her own equalizer identification indicators for a particular genre of music. For example, the headphone may include a USB port or wireless Bluetooth technology that allow a user to import and store custom audio clips from a smartphone, laptop, computer, tablet and/or cloud-based application. Each custom audio clip can serve as a unique equalizer identification indicator for a particular genre of music.

In other embodiments, the headphone can include a recording microphone to create and store custom audio clips as unique equalizer identification indicators for a particular genre of music.

Turning next to FIGS. 1A through 1F, exemplary EQ settings are illustrated for, respectively, a Flat EQ setting, a Manual EQ setting, a Classical EQ setting, a Hip Hop EQ setting, a Metal EQ setting, and a Spoken Word EQ setting. These settings can be stored within the headphone software and/or hardware and recalled as presets.

Figure 2:
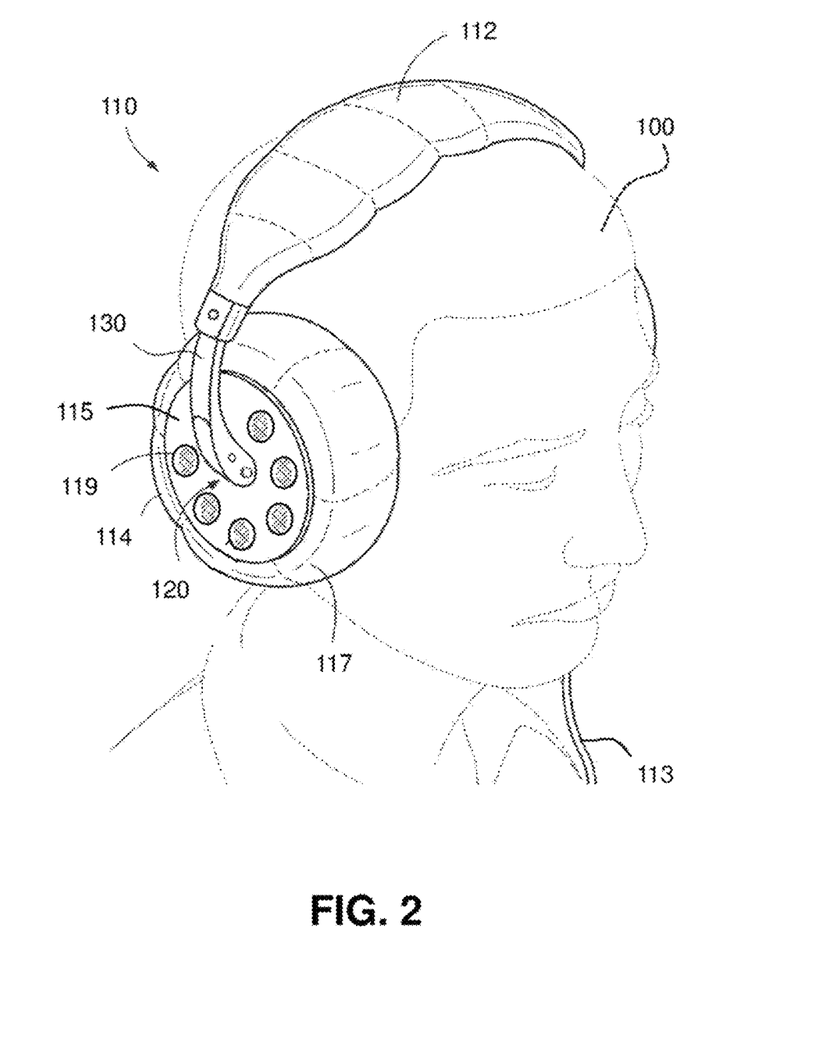
FIG. 2 is a perspective view of a headphone with multiple equalizer presets actuatable with button-type switches.

FIG. 2 shows a listener 100 wearing an over-the-ear headphone 110 with multiple equalizer presets actuatable with button-type switches. Headphone 110 includes a head harness 112, an earpiece 114, a baseplate 115, and an ear cushion 117. A slidably adjustable earpiece support 130 extends downwardly from either side of head harness 112. Earpiece baseplate 115 is fastened to earpiece support 130 by a ball-and-socket mechanism 120. A cable 113 delivers electrical signals to and from the device from which the selected music or sound is being reproduced, such as a smart phone, a digital tablet or a laptop computer, as illustrated in FIG. 1. A wireless headphone configuration would omit cable 113.

As further shown in FIG. 2, headphone 110 includes on its baseplate 115 a plurality of actuatable EQ selectors, one of which is denoted in FIG. 2 as EQ selector 119. Each of selectors 119 selectors corresponds to an equalization setting for a particular genre of music, such as those illustrated in FIGS. 1A through 1F.

Besides the particular headphone construction illustrated in FIG. 2, other headphone constructions could be utilized with the present equalizer selection technique. Such other headphone constructions should include a baseplate or other surface on which to locate actuatable selectors that corresponding to equalization settings for particular genres of music or other sound reproduction.

Figure 3:
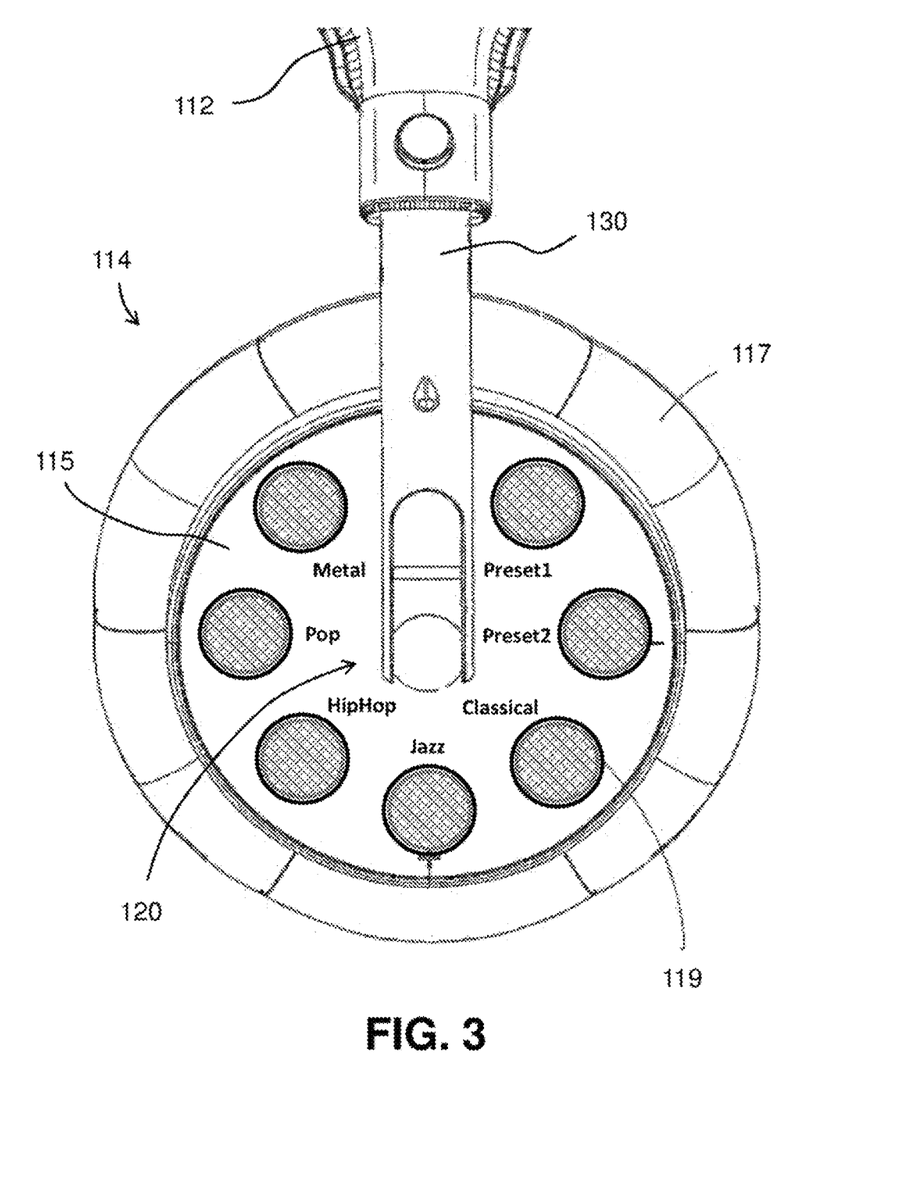
FIG. 3 is an enlarged side view of the headphone of FIG. 2, showing in particular the array of button-type switches for actuating one of a plurality of equalizer presets.

FIG. 3 is an enlarged side view of headphone of FIG. 2 containing an array of actuatable button-type switches, one of which is denoted in FIG. 3 as button switch 119. As shown, button switch 119 actuates an equalizer setting corresponding to a Classical genre preset, an example for which is illustrated in FIG. 1C. In addition to the Classical genre, the other button switches actuate, going counterclockwise in FIG. 3 from the earpiece support 130, a Metal genre preset, a Pop genre preset, a Hip Hop genre preset, and a Jazz preset. Going further counterclockwise in FIG. 3 from Classical genre button switch 119 are two additional button switches denoted as Preset2 and Preset1. In the illustrated embodiment, Preset1 and Preset2 are customizable settings that the headphone wearer can individually program. For example, the Manual EQ setting illustrated in FIG. 1B could be programmed into headphone 110 as Preset1, and another customized EQ setting could be programmed as Preset2. The particular number of switches for preset genres and customizable settings is limited only by the ability of the headphone surface to physically accommodate the switches.

In some embodiments, headphone 110 can include a USB port, a Bluetooth adaptor and/or a recording microphone to create and store custom audio clips to serve as unique equalizer identification indicators for each genre of music.

Figure 4:
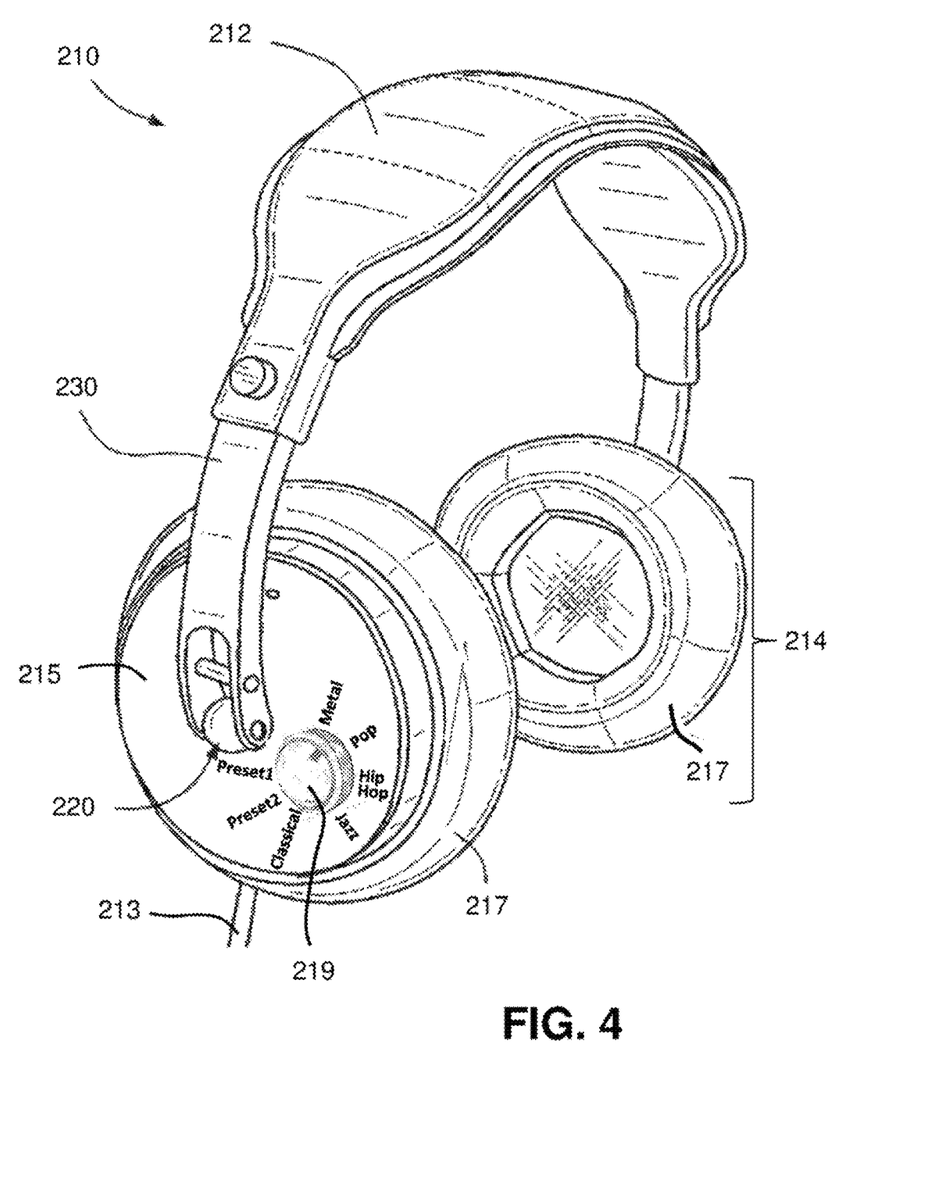
FIG. 4 is a perspective view of a headphone with multiple equalizer presets actuatable with a knob-type switch on the side of one of the headphone earpieces.

FIG. 4 illustrates another embodiment of the present headphone with multiple equalizer presets. In place of the individual button-type switches in the embodiment of FIGS. 2 and 3, headphone 210 of FIG. 4 has a knob-type switch 219 located on the side of one of the headphone earpieces. As with headphone 110 in FIGS. 2 and 3, headphone 210 in FIG. 4 includes a head harness 212, an earpiece 214, a baseplate 215, and an ear cushion 217. A slidably adjustable earpiece support 230 extends downwardly from either side of head harness 212. Earpiece baseplate 215 is fastened to earpiece support 230 by a ball-and-socket mechanism 220. A cable 213 delivers electrical signals to and from the device (not shown in FIG. 4) from which the selected music or sound is being reproduced, such as a smart phone, a digital tablet or a laptop computer.

As further shown in FIG. 4, the musical genre (Metal, Pop, Hip Hop, Jazz) and customized EQ preset (Preset1 and Preset2) are selected by turning knob switch until its indicator is pointed towards the desired EQ preset.

In some embodiments, headphone 210 can include a USB port, a Bluetooth adaptor and/or a recording microphone to create and store custom audio clips to serve as unique equalizer identification indicators for each genre of music.

In an enhanced embodiment, EQ settings in a headphone could be actuated by the wearer's spoken voice using voice recognition technology. For example, the wearer could speak the words "EQ Jazz" to actuate a Jazz equalization setting, rather than having to physically depress a switch or turn a knob to actuate a particular EQ setting.

While particular elements, embodiments and applications of the present invention have been shown and described, it will be understood, that the invention is not limited thereto since modifications can be made by those skilled in the art without departing from the scope of the present disclosure, particularly in light of the foregoing teachings.

What is claimed is:

1. A headphone comprising a pair of speakers for reproducing an input audio signal, the headphone further comprising:
    (a) a plurality of equalization selectors, each of said selectors directly actuating an equalization setting for a genre of music or that is individually programmed to a customizable equalization setting, said equalization setting comprising a specific distribution of relative amplitudes of sounds in predetermined frequency ranges; and (b) an equalizer identification indicator for actuating an audible communication perceivable to a headphone wearer in response to actuating an equalization setting, wherein said communication corresponds to said actuated equalization setting, and wherein said communication is perceived differently from the input audio signal being reproduced on said headphone speakers, wherein said communication is selected from the group consisting of a piece of music associated with a particular genre of music and a sound imitation associated with a particular genre of music, and wherein said particular genre of music corresponds to said actuated equalization setting.

2. The headphone of claim 1, wherein said piece of music is produced by a single musical instrument.

3. The headphone of claim 1, wherein said piece of music is produced by a collection of musical instruments.

4. The headphone of claim 1, wherein said piece of music is an instrumental riff.

5. The headphone of claim 1, wherein said piece of music is a song.

6. The headphone of claim 1, wherein said sound imitation emulates a sound of nature.

7. The headphone of claim 1, wherein said sound imitation emulates a mechanical object.

8. The headphone of claim 1, wherein said sound imitation emulates machinery.

9. A headphone comprising a pair of speakers for reproducing an input audio signal, the headphone further comprising:

(a) a plurality of equalization selectors, each of said selectors directly actuating an equalization setting for a genre of music or that is individually programmed to a customizable equalization setting, said equalization setting comprising a specific distribution of relative amplitudes of sounds in predetermined frequency ranges; and (b) an equalizer identification indicator for actuating an audible communication perceivable to a headphone wearer in response to actuating an equalization setting, wherein said communication corresponds to said actuated equalization setting, and wherein said communication is perceived differently from the input audio signal being reproduced on said headphone speakers, wherein said communication is a custom audio clip selected by a user and imported into said headphone, and wherein said audio clip is chosen by said user to represent a particular genre of music that corresponds to said actuated equalization setting.

* * * * *